(12) United States Patent
Lee et al.

(10) Patent No.: US 11,699,621 B2
(45) Date of Patent: Jul. 11, 2023

(54) METHOD FOR PATTERNING A LANTHANUM CONTAINING LAYER

(71) Applicant: Taiwan Semiconductor Manufacturing Co., Ltd., Hsinchu (TW)

(72) Inventors: Kun-Yu Lee, Tainan (TW); Huicheng Chang, Tainan (TW); Che-Hao Chang, Hsinchu (TW); Ching-Hwanq Su, Tainan (TW); Weng Chang, Hsinchu (TW); Xiong-Fei Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 51 days.

(21) Appl. No.: 17/521,374

(22) Filed: Nov. 8, 2021

(65) Prior Publication Data
US 2022/0059412 A1 Feb. 24, 2022

Related U.S. Application Data

(60) Continuation of application No. 16/569,820, filed on Sep. 13, 2019, now Pat. No. 11,171,061, which is a
(Continued)

(51) Int. Cl.
*H01L 21/8238* (2006.01)
*H01L 27/092* (2006.01)
(Continued)

(52) U.S. Cl.
CPC ........... *H01L 21/823857* (2013.01); *H01L 21/823821* (2013.01); *H01L 27/0924* (2013.01);
(Continued)

(58) Field of Classification Search
CPC ..... H01L 21/823857; H01L 21/823821; H01L 27/0924; H01L 21/02178; H01L 21/02192;
(Continued)

(56) References Cited

U.S. PATENT DOCUMENTS 7,126,199 B2  10/2006 Doczy et al.
7,993,999 B2  8/2011 Basker et al.
(Continued)

FOREIGN PATENT DOCUMENTS

CN  103839810 A  6/2014
CN  107134455 A  9/2017
(Continued)

*Primary Examiner* — David Vu
(74) *Attorney, Agent, or Firm* — Slater Matsil, LLP

(57) ABSTRACT

Embodiments described herein relate to a method for patterning a doping layer, such as a lanthanum containing layer, used to dope a high-k dielectric layer in a gate stack of a FinFET device for threshold voltage tuning. A blocking layer may be formed between the doping layer and a hard mask layer used to pattern the doping layer. In an embodiment, the blocking layer may include or be aluminum oxide ($AlO_x$). The blocking layer can prevent elements from the hard mask layer from diffusing into the doping layer, and thus, can improve reliability of the devices formed. The blocking layer can also improve a patterning process by reducing patterning induced defects.

20 Claims, 14 Drawing Sheets

Related U.S. Application Data division of application No. 15/937,472, filed on Mar. 27, 2018, now Pat. No. 10,504,795.

(51) Int. Cl.

| | |
|---|---|
| *H01L 29/66* | (2006.01) |
| *H01L 29/78* | (2006.01) |
| H01L 21/28 | (2006.01) |
| H01L 21/02 | (2006.01) |
| H01L 21/311 | (2006.01) |
| H01L 21/3115 | (2006.01) |

(52) U.S. Cl.
CPC .... *H01L 21/0228* (2013.01); *H01L 21/02178* (2013.01); *H01L 21/02192* (2013.01); *H01L 21/28185* (2013.01); *H01L 21/3115* (2013.01); *H01L 21/31111* (2013.01)

(58) Field of Classification Search
CPC ........... H01L 21/0228; H01L 21/28185; H01L 21/31111; H01L 21/3115; H01L 21/02321; H01L 21/31144; H01L 21/32134; H01L 29/511; H01L 29/517; H01L 29/66795; H01L 29/785; H01L 21/2822; H01L 27/0922
See application file for complete search history.

(56) References Cited

U.S. PATENT DOCUMENTS

| | | | |
|---|---|---|---|
| 8,309,419 | B2 | 11/2012 | Schaeffer et al. |
| 8,901,664 | B2 | 12/2014 | Basker et al. |
| 9,178,036 | B1 | 11/2015 | Xie et al. |
| 9,490,255 | B1 | 11/2016 | Edge et al. |
| 9,748,145 | B1 | 8/2017 | Kannan et al. |
| 10,431,583 | B2 | 10/2019 | Kim et al. |
| 2006/0113603 | A1 | 6/2006 | Currie |
| 2010/0203704 | A1 | 8/2010 | Inumiya et al. |
| 2011/0298062 | A1 | 12/2011 | Ganguli et al. |
| 2013/0181269 | A1 | 7/2013 | Chen |
| 2013/0280902 | A1 | 10/2013 | Jagannathan et al. |
| 2014/0027818 | A1 | 1/2014 | Asenov |
| 2014/0231931 | A1 | 8/2014 | Chi et al. |
| 2015/0372097 | A1 | 12/2015 | Bao et al. |
| 2017/0250117 | A1 | 8/2017 | Kannan et al. |

FOREIGN PATENT DOCUMENTS

| | | |
|---|---|---|
| TW | 201021114 A | 6/2010 |
| TW | 201214532 A | 4/2012 |
| TW | 201604929 A | 2/2016 |

US 11,699,621 B2

METHOD FOR PATTERNING A LANTHANUM CONTAINING LAYER

PRIORITY CLAIM AND CROSS-REFERENCE

This application is a continuation of U.S. application Ser. No. 16/569,820, filed on Sep. 13, 2019, entitled "Method for Patterning a Lanthanum Containing Layer," which is a divisional of U.S. application Ser. No. 15/937,472, filed on Mar. 27, 2018, now U.S. Pat. No. 10,504,795 issued Dec. 10, 2019, entitled "Method for Patterning a Lanthanum Containing Layer," each application is hereby incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. When a semiconductor device such as a fin field-effect transistor (FinFET) is scaled down through various technology nodes, several strategies have been employed to improve device performance, such as using high-k dielectric materials and metal gate electrode structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
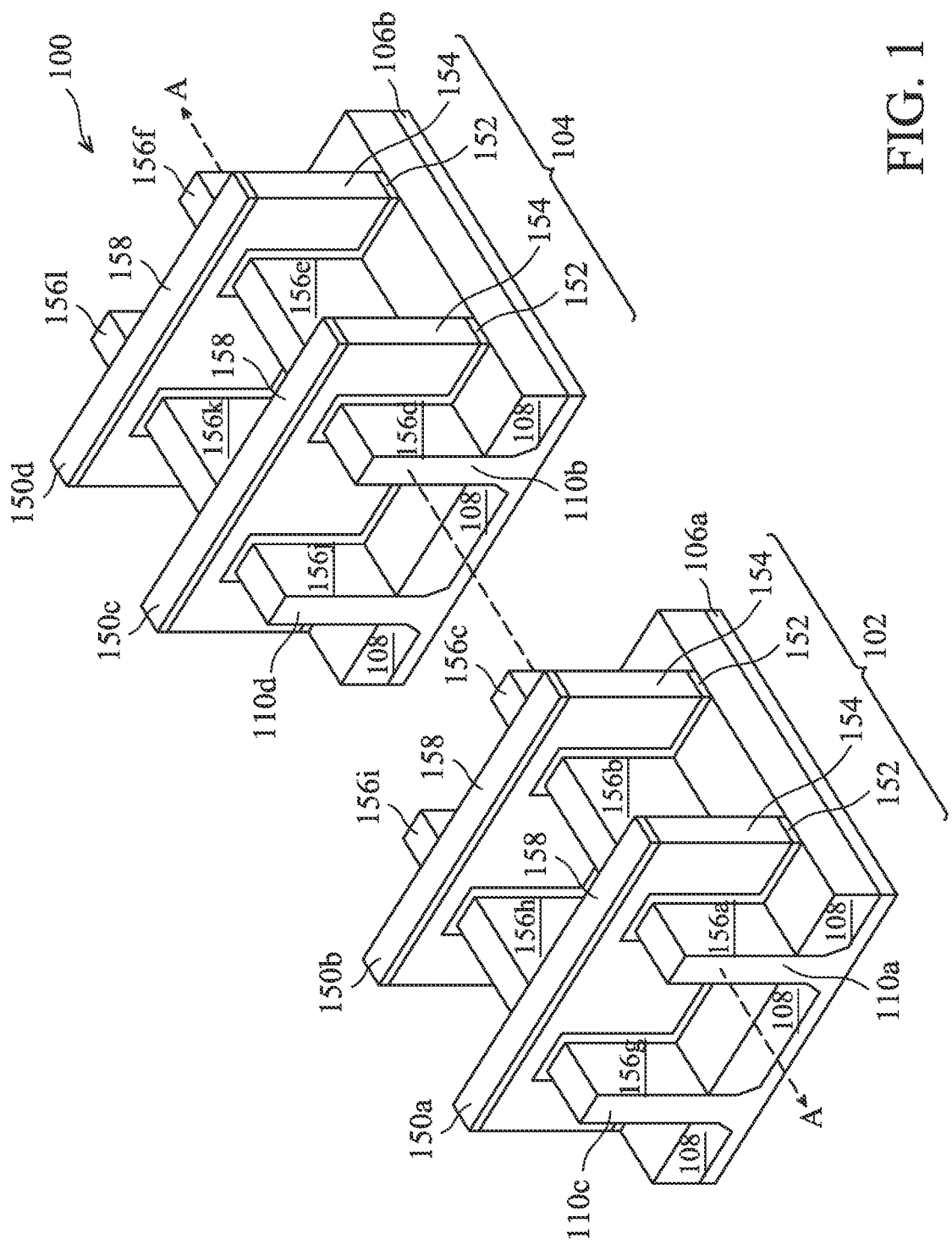
FIG. 1 is a three-dimensional view of an example of a device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein relate to a method for patterning a doping layer, such as a lanthanum containing layer, used to tune a high-k dielectric layer in a gate stack of a FinFET device. A blocking layer may be formed between the doping layer and a hard mask layer used to pattern the doping layer. In some embodiments, the blocking layer may include or be aluminum oxide ($AlO_x$). Aluminum oxide ($AlO_x$) can include any form of aluminum (Al) and oxygen, for example, but not limited to, aluminum (III) oxide ($Al_2O_3$), aluminum (II) oxide (AlO), and aluminum (I) oxide ($Al_2O$). The blocking layer may be deposited between a doping layer containing lanthanum oxide and a hard mask layer containing titanium nitride. The blocking layer can prevent elements from the hard mask layer from diffusing into the doping layer, and thus, can improve reliability of the devices formed. The blocking layer also can improve a patterning process by reducing patterning induced defects.

FIG. 1 schematically illustrates a device 100 in a three-dimensional view. Other aspects not illustrated in or described with respect to FIG. 1 may become apparent from the following figures and description. The device 100 may be part of an IC, such as a microprocessor, memory cell (such as static random-access memory (SRAM)), and/or other integrated circuits. In some embodiments, the device 100 includes P-type FinFET structures 102 formed in an N-doped region 106a and N-type FinFET structures 104 formed in a P-doped region 106b. One or both of the N-doped region 106a and P-doped region 106b may be a doped well formed by implantation into a semiconductor substrate. The semiconductor substrate may be or include a bulk semiconductor substrate, a semiconductor-on-insulator (SOI) substrate, or the like, which may be doped (e.g., with a P-type or an N-type dopant) or undoped. In some embodiments, the semiconductor material of the semiconductor substrate may include silicon (Si); germanium (Ge); a compound semiconductor; an alloy semiconductor; or a combination thereof.

Fins 110a and 110c are formed in the N-doped region 106a and fins 110b and 110d are formed in the P-doped region 106b. The fins 110a, 110b, 110c, 110d can be formed by etching trenches in the semiconductor substrate. After formation of the fins 110a, 110b, 110c, 110d, an insulating material may be deposited in the trenches between the fins 110a, 110b, 110c, 110d to form isolation regions 108. The isolation regions 108 may include or be an insulating material such as an oxide (such as silicon oxide), a nitride, the like, or a combination thereof. The insulating material may then be recessed such that the fins 110a, 110b, 110c, 110d protrude from between neighboring isolation regions 108, which may, at least in part, thereby delineate the fins 110a, 110c and fins 110b, 110d as active areas in the N-doped region 106a and P-doped region 106b, respectively.

After formation of the isolation regions 108, dummy gate stacks 150a, 150b, 150c, 150d are then formed on the fins 110a, 110b, 110c, 110d. Each dummy gate stack 150a, 150b, 150c, 150d includes an interfacial dielectric 152, a dummy gate 154, and a mask 158. The interfacial dielectrics 152, dummy gates 154, and masks 158 may be formed by sequentially depositing respective layers and patterning those layers, such as by appropriate photolithography and etch processes. For example, the interfacial dielectrics 152 may include or be silicon oxide, silicon nitride, the like, or multilayers thereof. The dummy gates 154 may include or be silicon (e.g., polysilicon) or another material. The masks 158 may include or be silicon nitride, silicon oxynitride, silicon carbon nitride, the like, or a combination thereof. The layers may be formed or deposited by any acceptable technique.

FIG. 1 further illustrates a reference cross-section A-A that is used in later figures. Cross-section A-A is in a plane along, e.g., channels in the fins 110a, 110b between opposing source/drain regions 156a-f. FIGS. 2 through 12 are schematic cross sectional views of the device 100 along the A-A plane. Particularly, FIGS. 2 through 12 schematically illustrate the device 100 at various stages for forming FinFET devices according to some embodiments.

Figure 2:
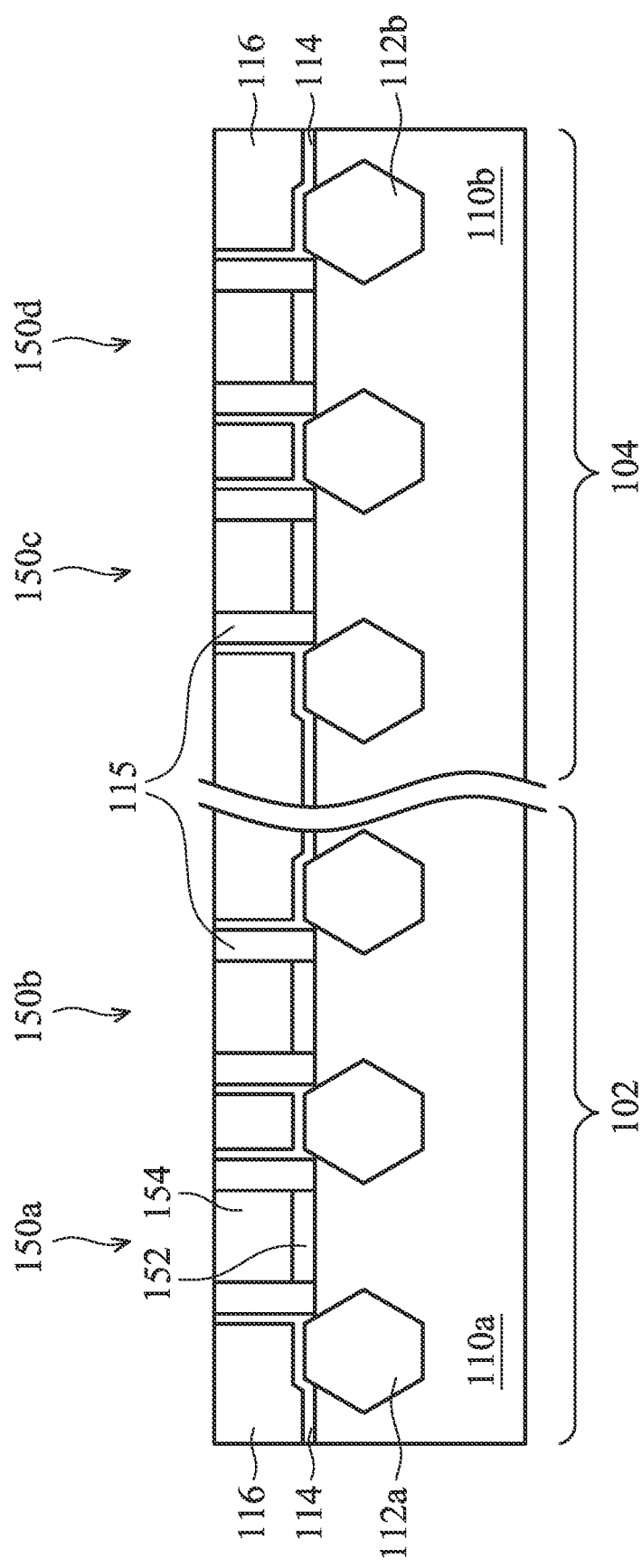
FIGS. 2 through 12 are schematic cross sectional views of a device being processed in accordance with some embodiments.

In FIG. 2, gate spacers 115 are formed along sidewalls of the dummy gate stacks 150a-150d, e.g., sidewalls of the respective interfacial dielectric 152, dummy gate 154, and mask (not shown). The gate spacers 115 may be formed by conformally depositing one or more layers for gate spacers 115 and anisotropically etching the one or more layers. The one or more layers for the gate spacers 115 may include or be silicon nitride, silicon oxynitride, silicon carbon nitride, the like, multi-layers thereof, or a combination thereof.

After formation of the gate spacers 115, source/drain regions 112a, 112b may be formed by forming recesses in the fins 110a, 110b then epitaxially growing source/drain materials from the fins 110a, 110b in the recesses. The recesses are formed in the fins 110a, 110b on opposing sides of the dummy gate stacks 150a-d. Recessing can be implemented by an etch process. The recesses can have various cross-sectional profiles based on the etch process implemented. The source/drain regions 112a, 112b may include or be silicon germanium, silicon carbide, silicon phosphorus, pure or substantially pure germanium, a III-V compound semiconductor, a II-VI compound semiconductor, or the like. Different materials can be used for source/drain regions 112a and 112b because the source/drain regions 112a are for p-type devices while the source/drain regions 112b are for n-type devices. Such different materials can be formed by sequential processes in which appropriate regions are masked during the formation of recesses and epitaxial growth in different fins 110a, 110b. In some examples, the source/drain regions 112a, 112b may also be doped, such as by in-situ doping during epitaxial growth and/or by implanting dopants into the epitaxy source/drain regions 112a, 112b after epitaxial growth. Example dopants can include or be, for example, boron for the epitaxy source/drain regions 112a to form p-type devices and phosphorus or arsenic for the epitaxy source/drain regions 112b to form n-type devices.

After formation of the source/drain regions 112a, 112b, a contact etch stop layer (CESL) 114 is formed. The contact etch stop layer 114 can provide a mechanism to stop an etching process when forming, e.g., contacts. A contact etch stop layer 114 may be formed of a dielectric material having a different etch selectivity from adjacent layers, for example, a subsequent interlayer dielectric. The contact etch stop layer 114 may be conformally deposited over the epitaxy source/drain regions 112a, 112b, dummy gate stacks 150a-d, gate spacers 115, and isolation regions 108. The contact etch stop layer 114 may comprise or be silicon nitride, silicon carbon nitride, silicon carbon oxide, carbon nitride, the like, or a combination thereof.

An interlayer dielectric layer 116 is formed over the contact etch stop layer 114. The interlayer dielectric layer 116 may comprise or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof.

A planarization process, such as a CMP, may be performed to level the top surfaces of the interlayer dielectric layer 116 and contact etch stop layer 114 with top surfaces of the dummy gates 154. In some embodiments, a CMP process may be implemented as the planarization process, which may also remove the masks 158 and upper portions of the gate spacers 115. As a result, top surfaces of the dummy gates 154 are exposed through the interlayer dielectric layer 116 and the contact etch stop layer 114, as shown in FIG. 2.

Figure 3:
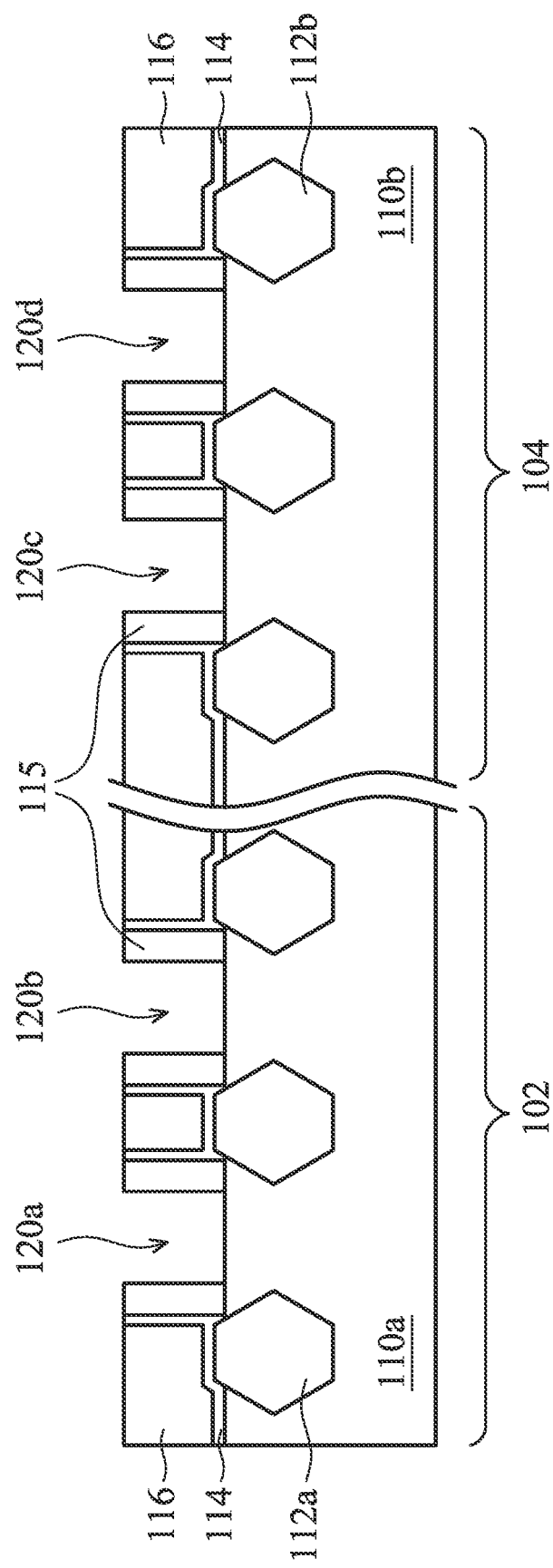

In FIG. 3, the dummy gates 154 and the interfacial dielectrics 152 may be removed to form trenches 120a, 120b, 120c, 120d where replacement gate stacks are subsequently formed. The dummy gates 154 may be removed by an etch process, wherein the interfacial dielectrics 152 act as an etch stop. Subsequently, the interfacial dielectrics 152 can be removed by a different etch process.

Figure 4:
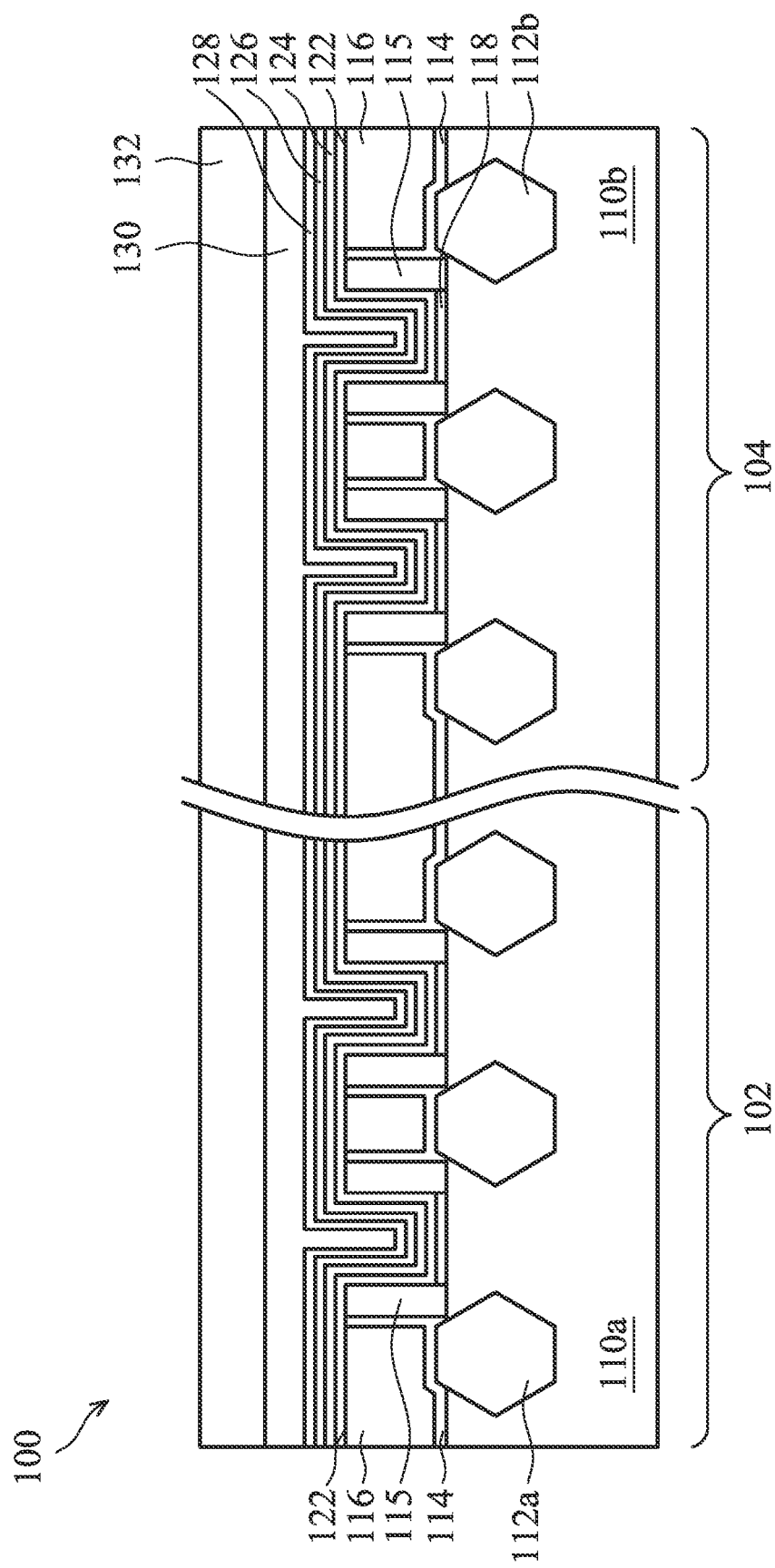

In FIG. 4, a high-k dielectric layer 122 is formed conformally over bottoms and sidewalls of the trenches 120a, 120b, 120c, 120d. In some embodiments, respective interfacial layers 118 may be formed at the bottoms of the trenches 120a-d prior to forming the high-k dielectric layer 122 and/or interfacial dielectrics 152 may remain to be the interfacial layers 118. The interfacial layer 118 may include or be silicon oxide, HfSiO, or oxynitride formed by a proper technique, such as atomic layer deposition (ALD), chemical vapor deposition (CVD), thermal oxidation, physical vapor deposition (PVD), or UV-ozone oxidation.

The high-k dielectric layer 122 includes one or more high-k dielectric materials. In some embodiments, the high-k dielectric layer 122 includes one of $HfO_2$, HfZrO, HfSiO, SiO, HfTaO, HMO, TiO, $Ta_2O_5$, which may be later doped with lanthanum. The high-k dielectric layer 122 may be formed by ALD, CVD, metal-organic CVD (MOCVD), another suitable technique, or a combination thereof. In some embodiments, the high-k dielectric layer 122 is formed by a blanket, conformal deposition. The high-k dielectric layer 122 may have a thickness in a range from about 15 angstroms to about 30 angstroms.

In some embodiments, the high-k dielectric layer 122 includes one or more hafnium oxide layers formed by an ALD process. For example, the high-k dielectric layer 122 may include hafnium oxide, hafnium silicon oxide, hafnium silicon oxynitride, hafnium tantalum oxide, hafnium titanium oxide, hafnium zirconium oxide, or a combination thereof. In some embodiments, the hafnium oxide layer may be formed by an ALD process using $HfCl_4$ and $H_2O$ as precursors.

A lanthanum containing layer 124 is formed conformally over the high-k dielectric layer 122. The lanthanum containing layer 124 overlies the high-k dielectric layer 122 by a blanket, conformal deposition as shown in FIG. 4. The lanthanum containing layer 124 may be formed by ALD, CVD, MOCVD, or other suitable methods. In some embodiments, the lanthanum containing layer 124 may be a lanthanum oxide ($La_2O_3$) layer. The lanthanum oxide layer may be formed by an ALD process using a lanthanum source precursor, such as lanthanum silylamide ($La[N(SiMe_3)_2]_3$), lanthanum amidinates (for exampleTris(N,N'-di-i-propylformamidinato)lanthanum(III)), and an oxygen source precursor, such as an oxygen ($O_2$) gas and ozone ($O_3$) gas with or without a plasma. In some embodiments, the lanthanum containing layer 124 may have a thickness in a range from about 3 angstroms to about 6 angstroms. In some embodiments, the lanthanum oxide layer 124 may be deposited by performing about 4 cycles to 8 cycles of an ALD process. The lanthanum containing layer 124 is implemented as a dopant source for doping the high-k dielectric layer 122 in selected regions to tune a capacitance and/or work function of certain devices, such as in gate stacks for pFinFET structures.

A blocking layer 126 is formed conformally over the lanthanum containing layer 124. The blocking layer 126 is configured to prevent diffusion between the lanthanum containing layer 124 and a subsequent layer, such as a hard mask layer, during subsequent processes. The blocking layer 126 may also improve a patterning process and processing uniformity across a substrate.

In some embodiments, the blocking layer 126 includes an aluminum oxide layer formed by an ALD process. For example, the blocking layer 126 may include aluminum oxide (AlO) formed by an ALD process using trimethylaluminum (TMA) and water vapor as precursors. In some embodiments, the blocking layer 126 may be formed by an ALD process using trimethylaluminum (TMA) and water vapor as precursors for about 10 cycles to about 30 cycles. In some embodiments, the blocking layer 126 may have a thickness equal to or greater than about 10 angstroms. For example, the blocking layer 126 may have a thickness in a range from about 10 angstroms to about 30 angstroms, for example, about 15 angstroms.

A hard mask layer 128 is formed conformally over the blocking layer 126. The hard mask layer 128 may be used to pattern the lanthanum containing layer 124 so that the lanthanum containing layer 124 is in selected regions to dope the high-k dielectric layer 122. The hard mask layer 128 can be a titanium containing layer, such as a TiN layer. The hard mask layer 128 may be formed by an ALD process. In some embodiments, the hard mask layer 128 is formed by an ALD process using a titanium source precursor, such as titanium tetrachloride ($TiCl_4$), and a nitrogen source precursor, such as ammonia ($NH_3$) and/or hydrazine ($N_2H_4$). In some embodiments, the hard mask layer 128 has a thickness in a range from about 10 angstroms to about 30 angstroms, for example, about 20 angstroms.

As discussed above, the blocking layer 126 can provide advantages, such as improving processing uniformity. In tests, the inventors have discovered that uniformity of concentrations of titanium and lanthanum across the substrate (e.g., wafer) can be improved by implementing a blocking layer, like blocking layer 126. Without a blocking layer, it was discovered that a concentration of titanium can decrease from the center of the substrate to the edge of the substrate and that a concentration of lanthanum can increase from the center of the substrate to the edge of the substrate. With a blocking layer (e.g., blocking layer 126), it was discovered that respective concentrations of titanium and lanthanum can be substantially uniform from the center of the substrate to the edge of the substrate. With substantially uniform concentrations of titanium and lanthanum, various subsequent processes, such as etch processes, can have more uniform results across the substrate. This can lead to a higher yield of the formed devices.

Referring back to FIG. 4, after formation of the hard mask layer 128, a photolithography process is performed to pattern the hard mask layer 128. In some embodiments, a bottom anti-reflective coating (BARC) layer 130 and a photoresist layer 132 may be formed over the hard mask layer 128. The BARC layer 130 may be an organic material coated onto the substrate filling the trenches 120a, 120b, 120c, 120d. A photolithography process is performed to pattern the photoresist layer 132.

Figure 5:
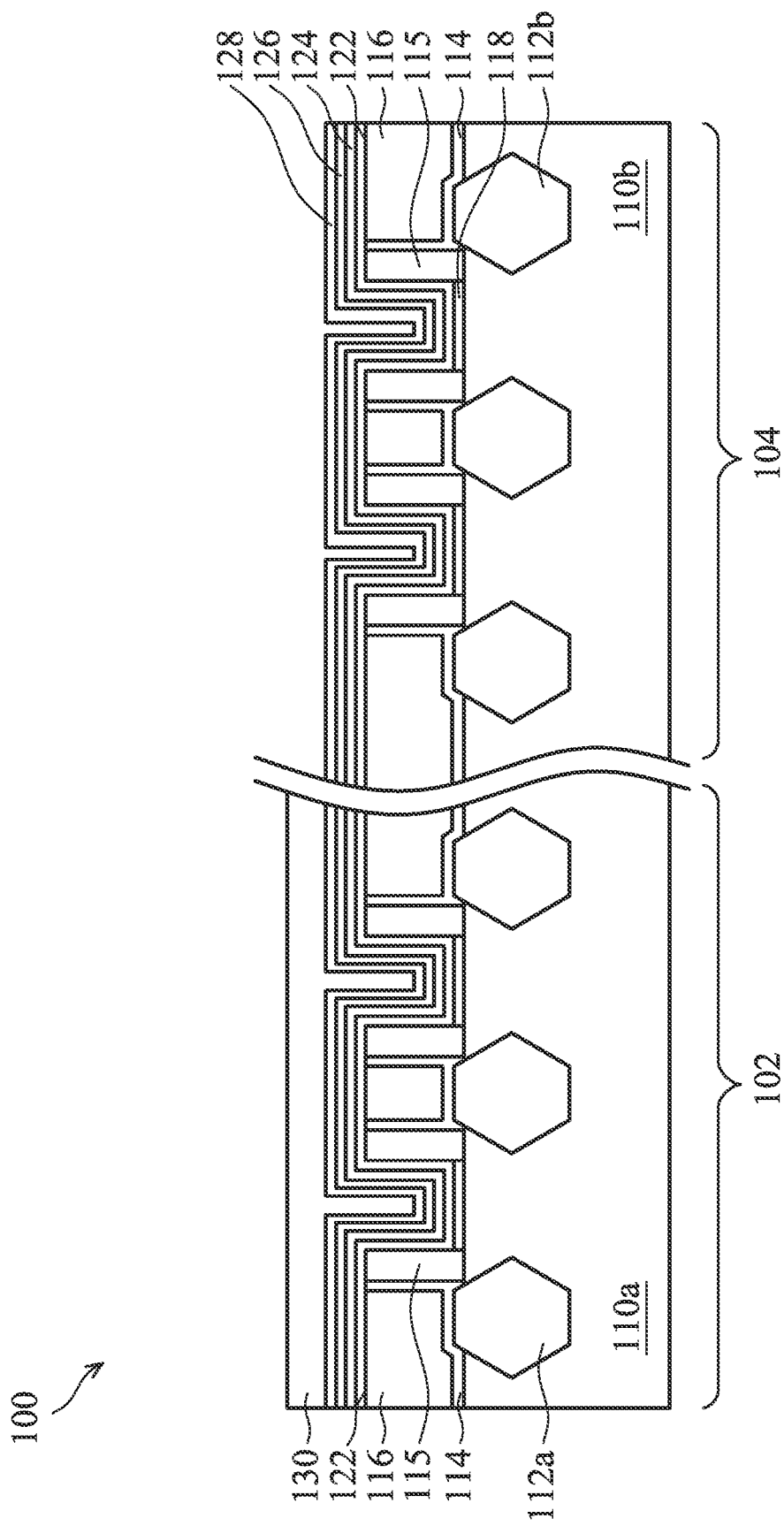

In FIG. 5, the BARC layer 130 is patterned using the patterned photoresist layer 132. A dry etch process may be used to pattern the BARC layer 130 while the hard mask layer 128 serves as an etch stop. In some embodiments, the patterned BARC layer 130 may expose certain regions, such as regions corresponding to the N-type FinFET structure 104 to allow processing over regions of the N-type FinFET structure 104 while leaving the remaining regions intact. It is noted that the patterned layers may be formed at other portion of the substrate, such as over the N-type FinFET structure 104.

The presence of the blocking layer 126 also shows an improvement in patterning the BARC layer 130. For example, less BARC residual is observed in transmission electron microscopy (TEM) images after a BARC dry etch process.

Figure 6:
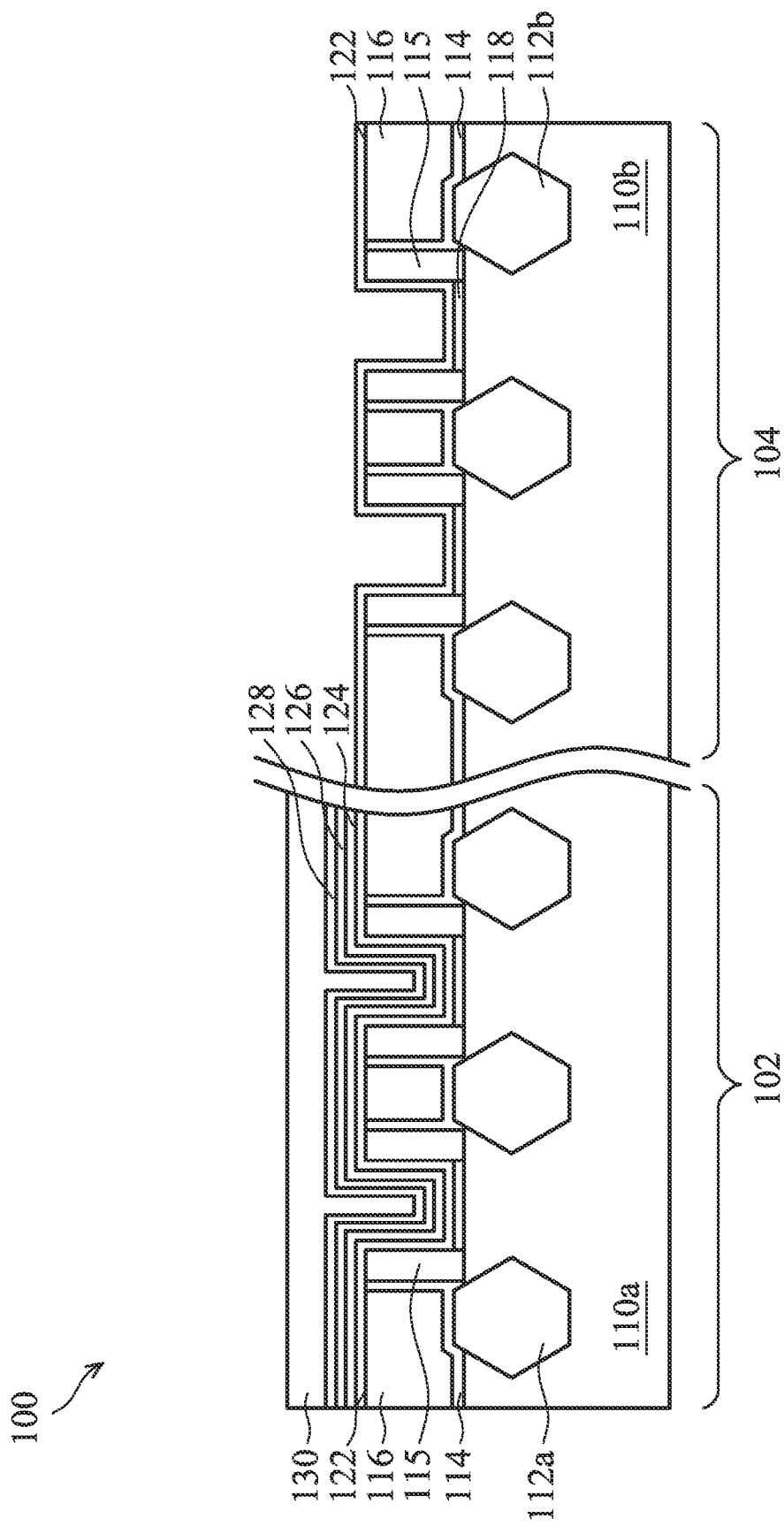

In FIG. 6, the lanthanum containing layer 124 is patterned. The lanthanum containing layer 124, the blocking layer 126, and the hard mask layer 128 are removed from regions exposed by the patterned layers, for example, the regions over the N-type FinFET structure 104. The photoresist layer 132 may be removed, for example, by an ashing process. Portions of the hard mask layer 128, the blocking layer 126, and the lanthanum containing layer 124 that are not underlying the patterned BARC layer 130 or are exposed by the patterned BARC layer 103 can then be removed by a suitable etch process.

In some embodiments, the etch process may be a wet etch process. For example, the etching process may be performed by dipping, immersing, or soaking the substrate with or in an etching solution in a wet tank. The etching solution may be an alkaline, neutral or acid solution with a pH value in a predetermined range. Selection of the etching solution is based on the materials in the lanthanum containing layer 124, blocking layer 126, and hard mask layer 128. In some embodiments, two or more etching solutions may be used to etch the hard mask layer 128, blocking layer 126, and lanthanum containing layer 124 sequentially. In some embodiments, one etching solution may be used to etch all three layers.

In some embodiments, the etching solution(s) may include a phosphoric acid (or orthophosphoric acid), or a mixture of phosphoric acid with other components such as hydrogen peroxide ($H_2O_2$). Other etchants, such as hydrofluoric acid (HF), hydrochloric acid (HCl), and/or sulfuric acid ($H_2SO_4$), may also be utilized. In an example, the ratio of phosphoric acid in deionized (DI) water of the etching solution is in a range from about 1:5 to about 1:50. These etchants may be utilized to maintain a desired level of pH value and/or to assist dissociation of the chemical compounds dissolved in the etching solution. In an example, the etching process may be maintained at a temperature in a range from about 20 to about 80 degrees Celsius. Alternatively or additionally, the layers may be removed by other etch process, such as a dry etch process, such as a vapor or a plasma process.

Figure 7:
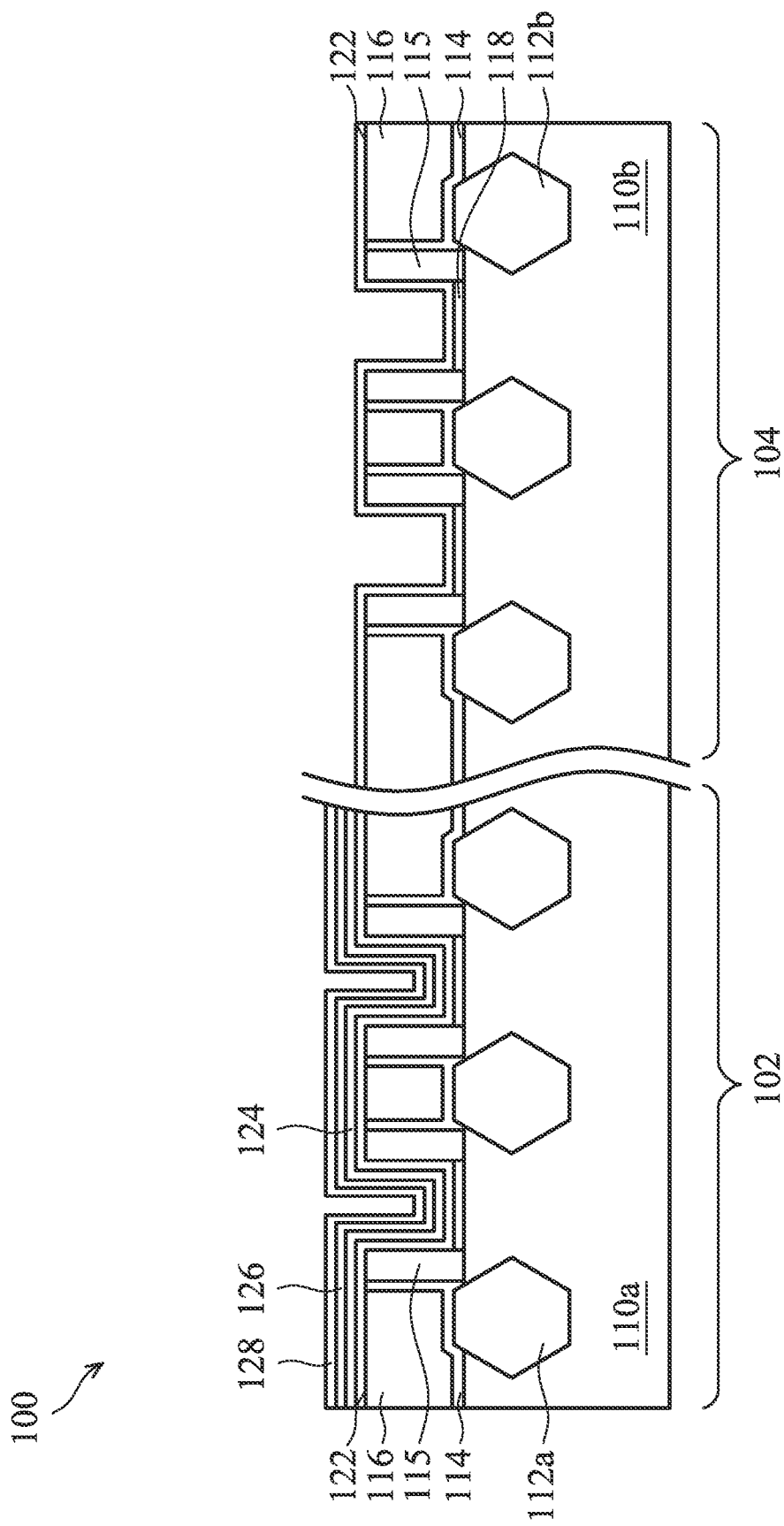

In FIG. 7, the BARC layer 130 is removed by an ashing process, for example, an ashing process using oxygen plasma.

Figure 8:
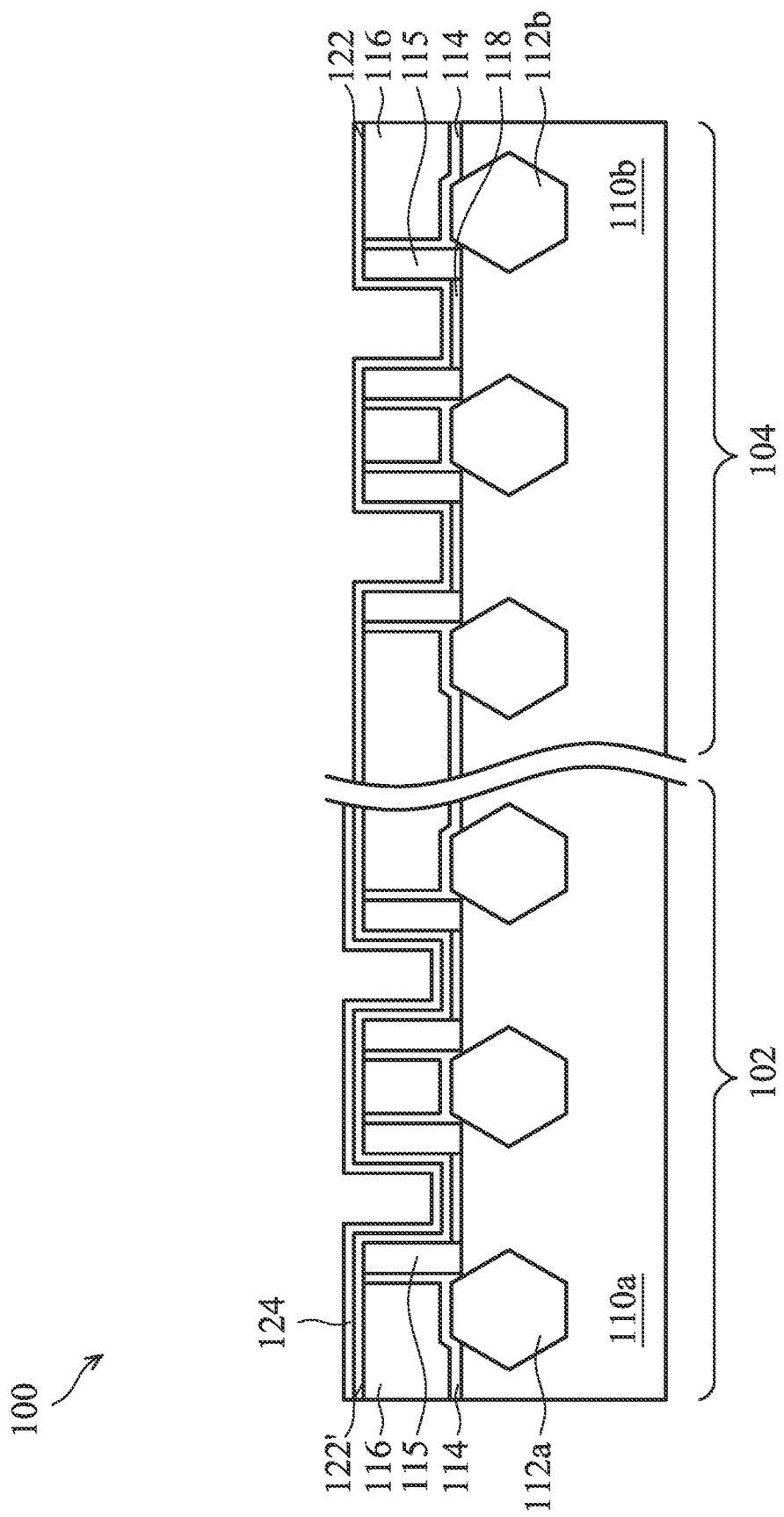

In FIG. 8, the blocking layer 126 and the hard mask layer 128 are removed from regions corresponding to the P-type FinFET structure 102, exposing the lanthanum containing layer 124. The blocking layer 126 and the hard mask layer 128 may be removed by an etch process. In some embodiments, the etch process may be a wet etch process. For example, the etching process may be performed by dipping, immersing, or soaking the substrate with or in an etching solution in a wet tank. The etching solution is selected to have higher etching rates (e.g., higher selectivity) for the blocking layer 126 and hard mask layer 128 than for the lanthanum containing layer 124.

In some embodiments, the etching solution may include $NH_4$, $H_2O_2$, and $H_2O$ in a ratio of 1:1:5 to etch both layers. In an example, the etching process may be performed at a temperature in a range from about 20° C. to about 80° C., for example at about 60° C. In some embodiments, the etch process may be performed for equal to or greater than 100 seconds, for example in a range from about 150 seconds to 300 seconds. In some embodiments, the etch process may be performed for about 250 seconds.

Because aluminum oxide can be easily removed by acid and base etch chemistry, the aluminum oxide in the blocking layer 126 can enlarge the window of etching selectivity between the lanthanum containing layer 124 and the hard mask layer 128. As a result, the blocking layer 126 can enable complete removal of titanium in the hard mask layer 128, and thus, can improve threshold voltage tuning in the device.

Figure 13:
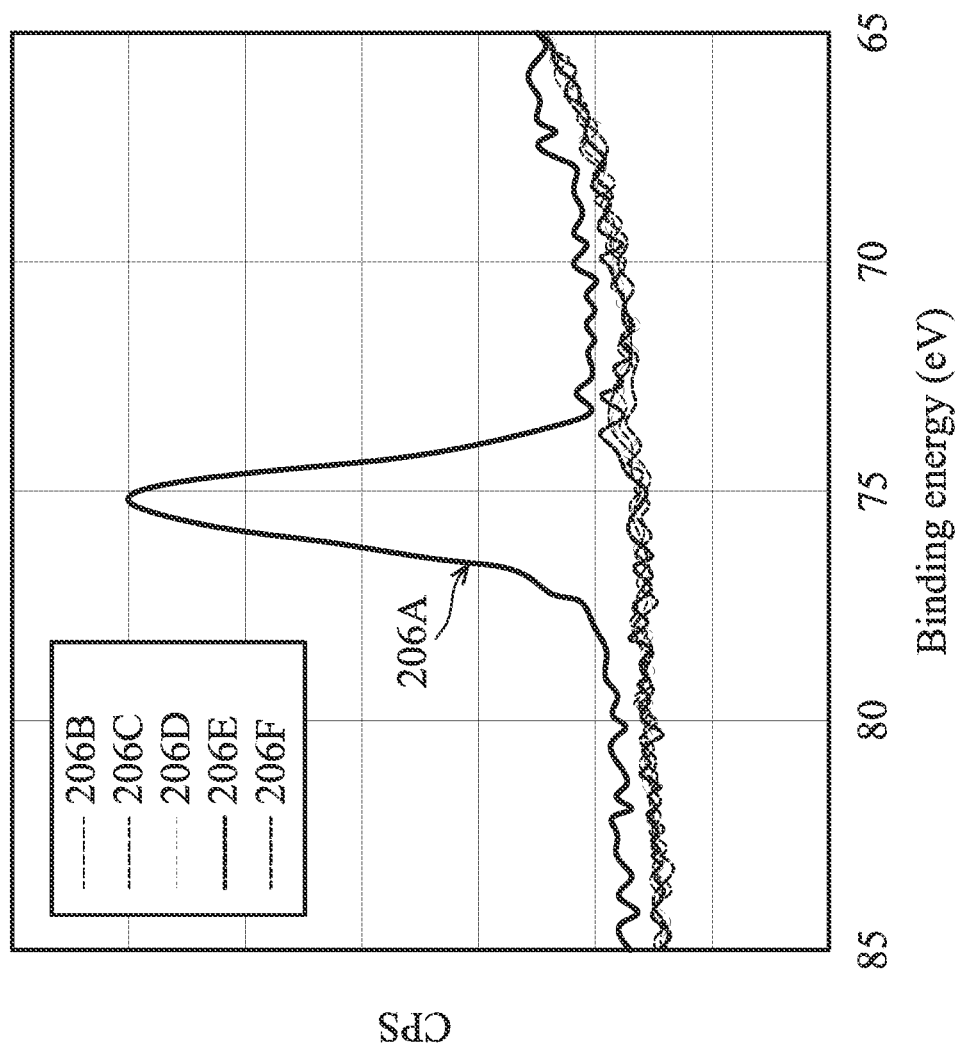
FIG. 13 includes schematic graphs showing concentrations of aluminum on and/or in a high-k dielectric layer after hard mask removal in accordance with some embodiments.

FIG. 13 includes schematic graphs showing concentrations of aluminum on and/or in a high-k dielectric layer 122 after hard mask removal. The concentrations are represented by counts per second (CPS) as a function of binding energy (eV). Graph 206A is a measurement of aluminum concentration after the blocking layer 126 is deposited on the lanthanum containing layer 124. The blocking layer 126 includes aluminum oxide formed by 15 ALD deposition cycles. Graphs 206B-206F are measurements of aluminum concentration after the etch processing to remove the hard mask layer 128 and the blocking layer 126 as described above. Graph 206B is a measurement of aluminum concentration after an etch process using an etching solution including $NH_4$, $H_2O_2$, and $H_2O$ at 40° C. for about 150 seconds. Graph 206C is a measurement of aluminum concentration after an etch process using an etching solution including $NH_4$, $H_2O_2$, and $H_2O$ at 40° C. for about 255 seconds. Graph 206D is a measurement of aluminum concentration after an etch process using an etching solution including $NH_4$, $H_2O_2$, and $H_2O$ at 40° C. for about 330 seconds. Graph 206E is a measurement of aluminum concentration after an etch process using an etching solution including $NH_4$, $H_2O_2$, and $H_2O$ at 60° C. for about 150 seconds. Graph 206F is a measurement of aluminum concentration after an etch process using an etching solution including $NH_4$, $H_2O_2$, and $H_2O$ at 60° C. for about 255 seconds. The graphs 206A-206F demonstrate that aluminum oxide can be easily removed using the etching solution to remove the hard mask layer 126.

Figure 14:
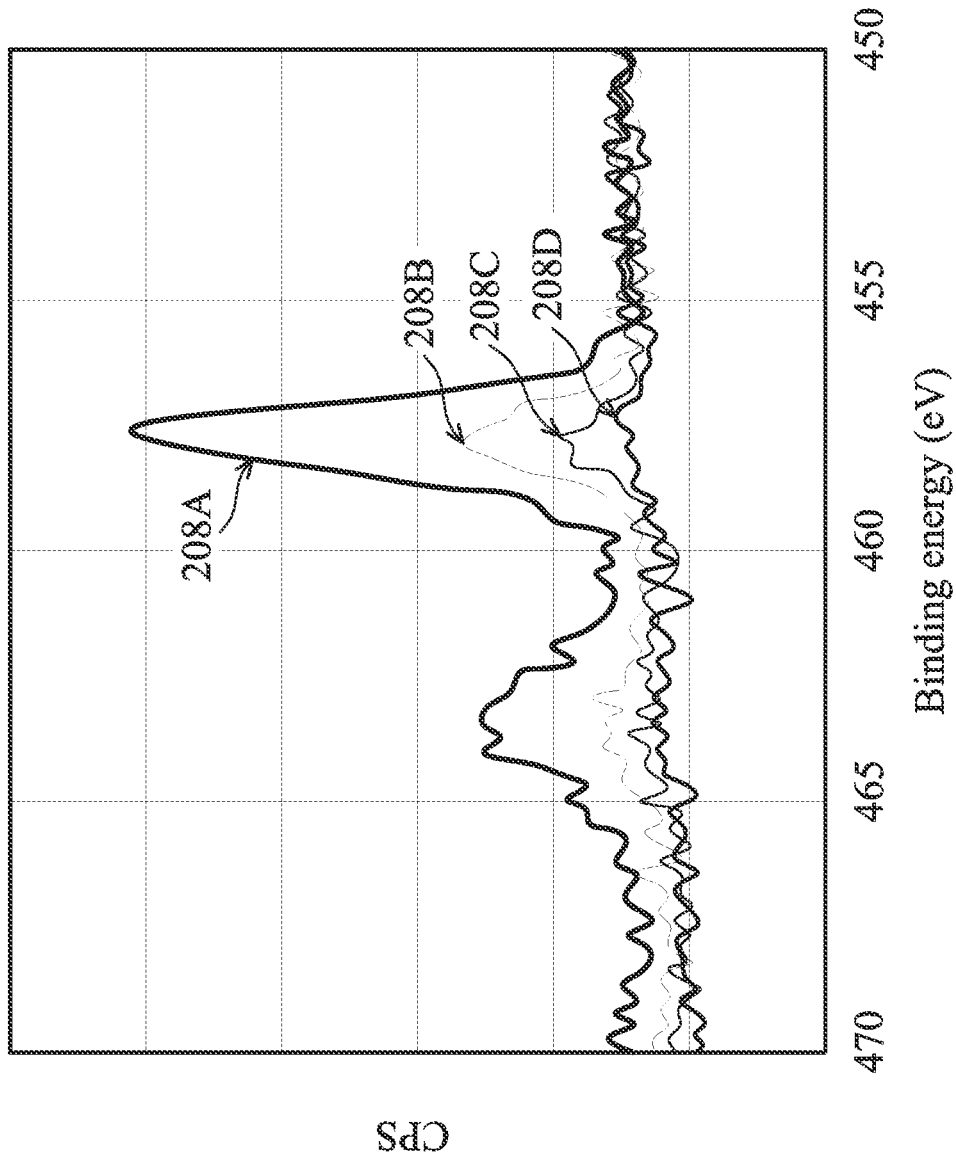
FIG. 14 includes schematic graphs showing concentrations of titanium on and/or in a high-k dielectric layer after hard mask removal in accordance with some embodiments.

FIG. 14 includes schematic graphs showing concentrations of titanium on and/or in a high-k dielectric layer 122 after hard mask removal. The concentrations are represented by CPS as a function of binding energy (eV). Graph 208A is a measurement of titanium concentration after a hard mask removal process when there is not a blocking layer formed between the hard mask layer 128 and the lanthanum containing layer 124. Graph 208B is a measurement of titanium concentration after a hard mask removal process when there is an aluminum oxide layer formed from 10 cycles of ALD process between the hard mask layer 128 and the lanthanum containing layer 124. Graph 208C is a measurement of titanium concentration after a hard mask removal process when there is an aluminum oxide layer formed from 15 cycles of ALD process between the hard mask layer 128 and the lanthanum containing layer 124. Graph 208D is a measurement of titanium concentration after a hard mask removal process when there is an aluminum oxide layer formed from 20 cycles of ALD process between the hard mask layer 128 and the lanthanum containing layer 124. Graphs 208A-208D demonstrate that the presence of aluminum oxide blocking layer can improve titanium removal. A thicker layer of aluminum oxide can provide more improvement than a thinner layer of aluminum oxide.

Referring back to FIG. 8, after removal of the blocking layer 126 and the hard mask layer 128, an anneal process is performed. The anneal process drives lanthanum in the lanthanum containing layer 124 into the high-k dielectric layer 122, forming a lanthanum doped high-k dielectric layer 122'. The anneal process may be performed in a range from about 600° C. to about 900° C. In some embodiments, the anneal process may be performed at about 800° C. In some embodiments, the lanthanum doped high-k dielectric layer 122' includes lanthanum doped hafnium oxide (LaHfO).

As shown in FIG. 8, the high-k dielectric layer 122 over the P-type FinFET structure 102 is covered by the lanthanum containing layer 124. The anneal process results in the lanthanum doped high-k dielectric layer 122' over the P-type FinFET structure 102 while the high-k dielectric layer 122 (e.g., not doped with lanthanum) remains over the N-type FinFET structure 104. The lanthanum doped high-k dielectric layer 122' may be designed to achieve a desired capacitance and/or work function to therefore achieve a desired threshold voltage of the P-type FinFET structure 102, which can achieve a desired performance. In some embodiments, the lanthanum doped high-k dielectric layer 122' may have a dielectric constant above 7.0.

In some embodiments, the lanthanum doped high-k dielectric layer 122' includes one of $HfO_2$, HfZrO, HfSiO, SiO, HfTaO, HfSiO, TiO, and $Ta_2O_5$ doped with lanthanum. In some embodiments, the high-k dielectric layer 122 may include hafnium oxide, and the lanthanum doped high-k dielectric layer 122' includes lanthanum doped hafnium oxide (LaHfO). In some embodiments, the high-k dielectric layer 122 may include hafnium oxide, and the lanthanum doped high-k dielectric layer 122' includes lanthanum oxide doped hafnium oxide (LaHfO).

Figure 9:
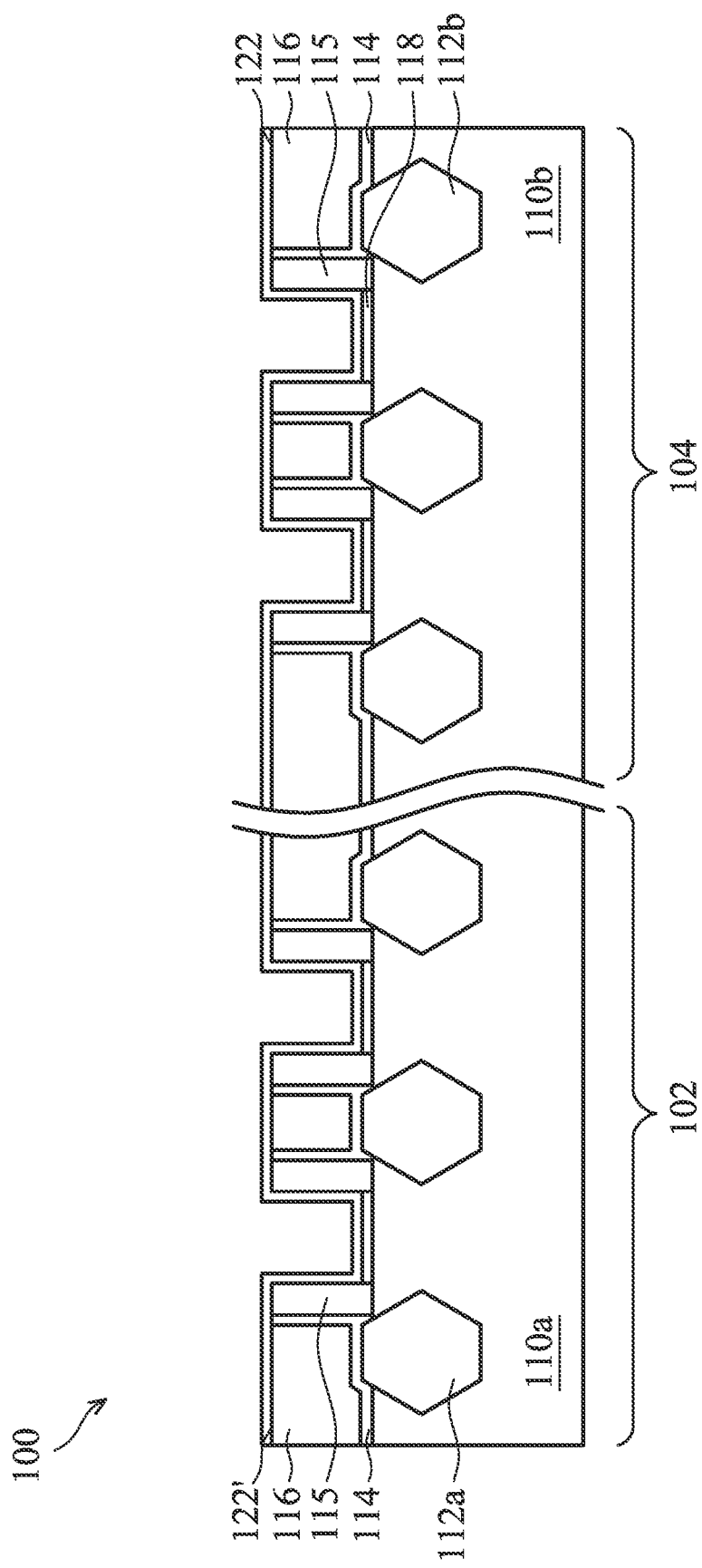

After the annealing process, the substrate may be treated to remove unconsumed lanthanum containing layer 124, as shown FIG. 9. Lanthanum containing material may be removed by an etch process. In some embodiments, the lanthanum containing layer 124 may be removed by a wet etch process using an acidic solution, such as an aqueous solution of carbon dioxide ($CO_2$), hydrochloric acid (HCl), phosphoric acid ($H_3PO_4$), acetic acid ($CH_3COOH$), or other suitable acid solution. The wet etch process may be performed at a temperature in a range from about 20° C. to about 80° C., for example at 40° C. The wet etch process may be performed in a range from about 20 seconds to about 100 seconds, for example about 60 seconds.

Figure 10:
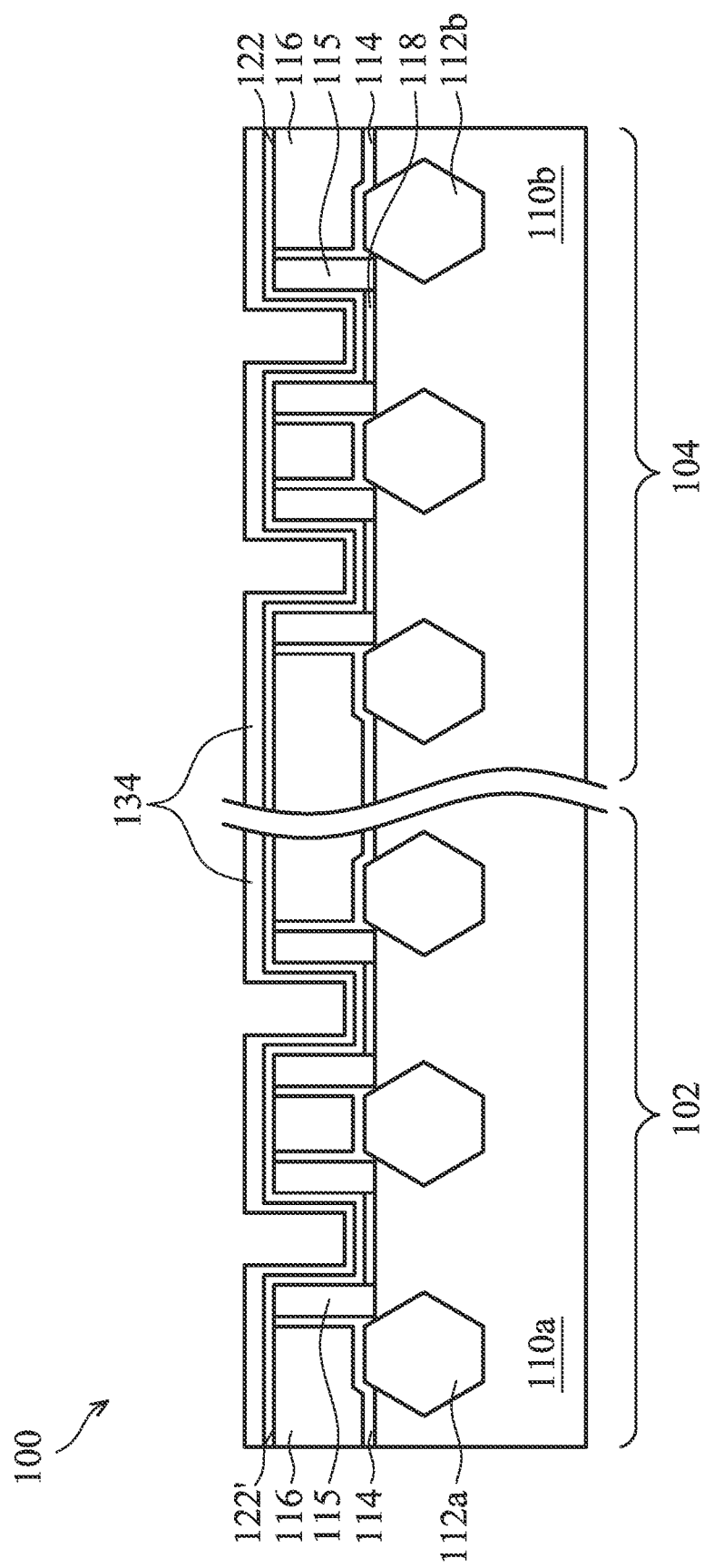

In FIG. 10, a work function layer 134 is formed. The work function layer 134 may include Ti, Ag, Al, TiSiN, TiAlN, TaC, TaCN, TaSiN, Mn, Zr, TiN, TaN, Ru, Mo, WN, Cu, W, any suitable material, or a combination thereof. A work function value is associated with the material composition of the work function layer 134. The material of the work function layer 134 is chosen to tune a work function value so that a desired threshold voltage (Vt) is achieved in the device that is to be formed in the respective region. The work function layer 134 may be deposited by CVD, ALD and/or other suitable processes. In some embodiments, the work function layer 134 is a TiSiN layer formed by an ALD process. In some embodiments, the ALD process may be followed by an anneal process, such as at a temperature of about 850° C. In some embodiments, the work function layer 134 has a thickness in a range from about 10 angstrom to about 20 angstroms, for example, about 15 angstroms. The thickness of the work function layer 134 may be altered and adjusted by altering process parameters during the ALD deposition process, such as the number of cycles.

In some embodiments, after formation of the work function layer 134 and the anneal process, a cap layer may be formed over the work function layer 134. The cap layer may be a sacrificial layer configured to protect the work function layer 134 in subsequent processes. In some embodiments, the cap layer may be a silicon layer formed by CVD. In some embodiments, the cap layer may have a thickness of about 30 angstroms. An anneal process may be performed to achieve a desirable work function value. In some embodiments, the anneal process may be performed at a temperature in a range from about 900° C. to about 950° C., for example, about 925° C.

After the anneal process, the cap layer may be removed for further processing, for example, deposition of gate fill material. In some embodiments, the removal of cap layer may be removed by a dry etch process. For example, the cap layer may be removed using a plasma of etching gas. In some embodiments, the etching gas may include nitrogen tri-fluoride ($NF_3$) and hydrogen ($H_2$).

Figure 11:
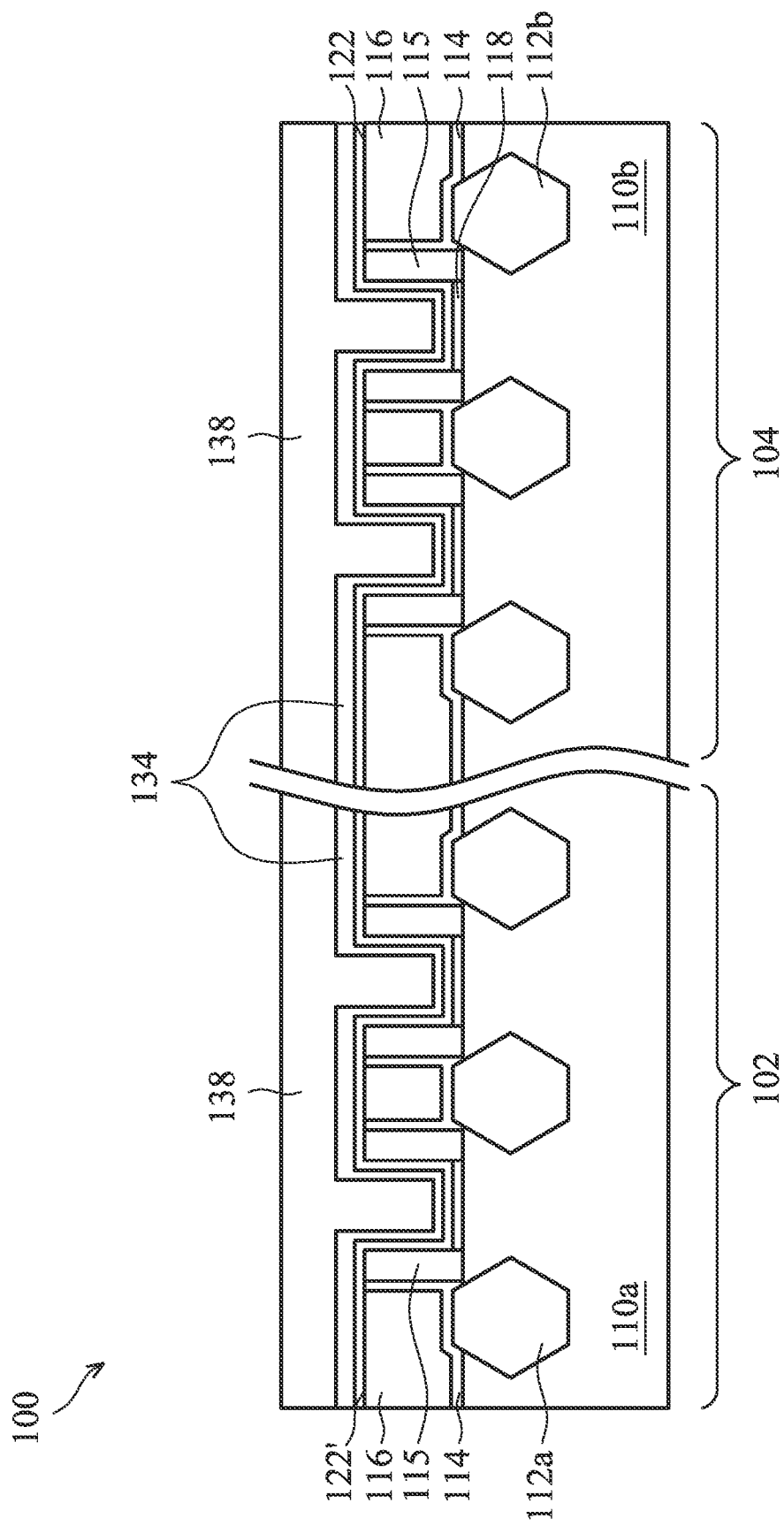
Figure 12:
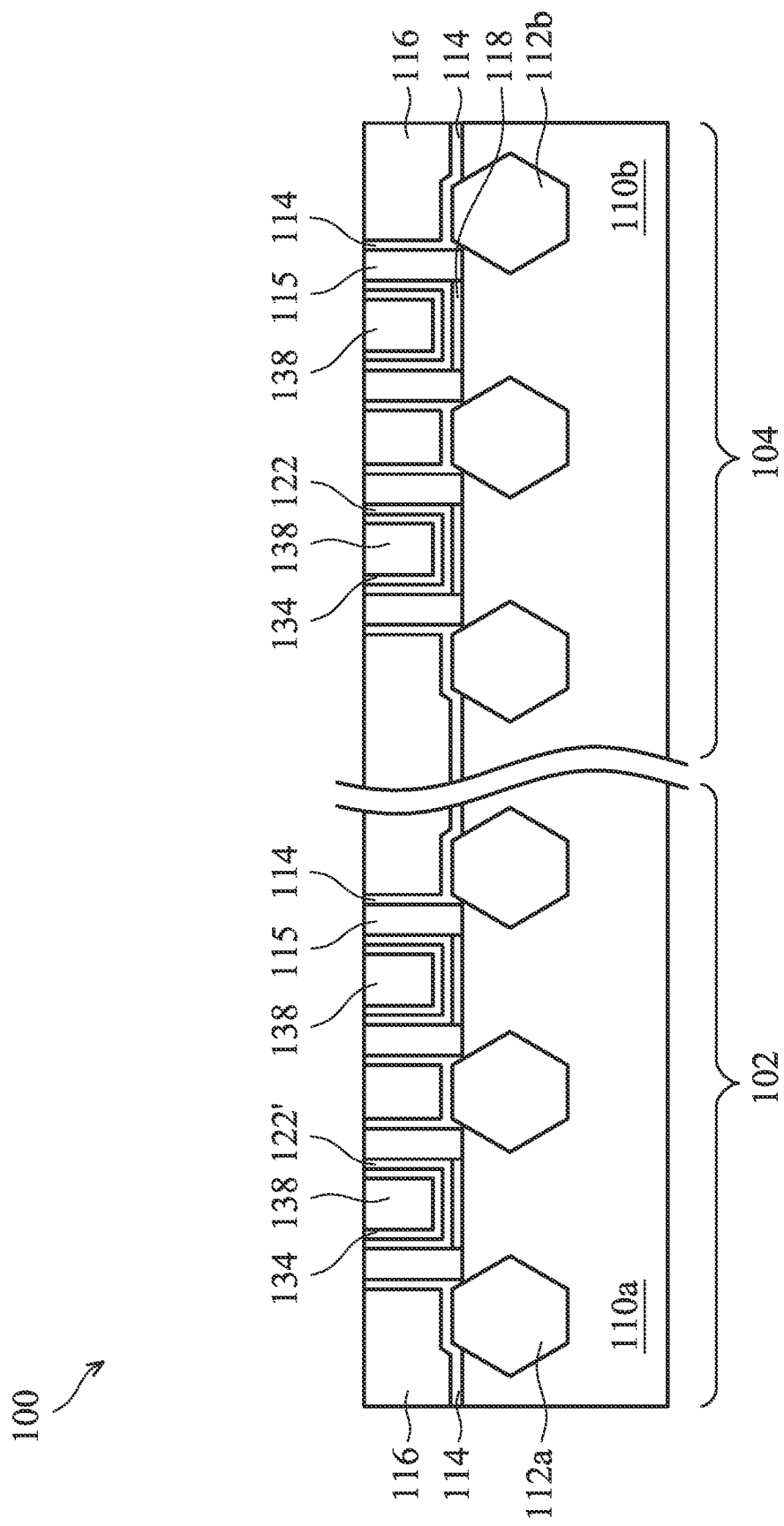

In FIG. 11, the trenches 120a-d may be filled with a conductive material 138 for forming gate electrodes therein as shown in FIG. 12. The conductive material 138 may be formed by CVD, ALD, PVD, metal-organic chemical vapor deposition (MOCVD), plating, and/or other suitable processes. The conductive material may include tungsten (W), cobalt (Co), copper (Cu), aluminum (Al), or a combination thereof.

In FIG. 12, a planarization process, such as a CMP process, is performed after formation of the conductive material 138 to form top surfaces of the conductive material 138 coplanar with the top surface of the interlayer dielectric layer 116, and thus, form the gate stacks.

The lanthanum doped high-k dielectric layer 122' in gate stacks in the P-type FinFET structures 102 in FIG. 12 can therefore be doped with lanthanum, while the high-k dielectric layer 122 in gate stacks in the N-type FinFET structures 104 are not doped with lanthanum. A concentration of lanthanum in the lanthanum doped high-k dielectric layer 122' in the P-type FinFET structures 102 can be in a range from about 5 atomic percent (at. %) to about 10 at. %, and the high-k dielectric layer 122 in gate stacks in the N-type FinFET structures 104 would be substantially free of lanthanum (e.g., possibly containing a negligible amount as a result of processing, such as described herein). Further, a concentration of titanium (e.g., from hard mask layer 128) in the lanthanum doped high-k dielectric layer 122' in the P-type FinFET structures 102 and the high-k dielectric layer 122 in gate stacks in the N-type FinFET structures 104 can be less than or equal to about 0.1 at. %. A ratio of the concentration of lanthanum to the concentration of titanium in the lanthanum doped high-k dielectric layer 122' in the P-type FinFET structures 102 can be greater than or equal to about 50, such as in a range from about 50 to about 100. Hence, processes described herein can enable a high content of lanthanum while permitting a low content of titanium.

The inventors have discovered that, by using a blocking layer in forming a device, a flat band voltage of the device can be increased with decreased capacitive effective thickness (CET) penalty when compared to methods that do not implement a blocking layer. Implementing thicker lanthanum containing layers (e.g., by implementing more ALD cycles) can result in increases in flat band voltages, although the increases in CET can be greater (but still less than an increase in CET without a blocking layer).

The inventors have further discovered that, based on measurements of maximum operation voltage at 125° C. for 10 year lifetime ($V_{max}$) to corresponding flat band voltage $V_{fb}$ from a short-loop reliability study, the lanthanum containing layer processed using an aluminum oxide blocking layer provide positive improvement in device reliability, such as time dependent dielectric breakdown (TDDB), which may be defined by maximum operation voltage at 125° C. for 10 year lifetime.

Some advantages of embodiments of the present disclosure include improved device reliability, such as improved nTDDB, reduced CET penalty without loss of voltage tuning capacity, and improved BARC patterning.

An embodiment of the present disclosure provides a method for semiconductor processing. The method comprises forming a film stack over a high-k dielectric layer, wherein the film stack includes a lanthanum containing layer formed over the high-k dielectric layer, a blocking layer formed over the lanthanum containing layer, and a hard mask layer formed over the blocking layer, removing the hard mask layer and the blocking layer, and performing an anneal process to drive lanthanum from the lanthanum containing layer to the high-k dielectric layer.

Another embodiment of the present disclosure provides a method comprising forming a high-k dielectric layer over a substrate, forming a lanthanum containing layer over the high-k dielectric layer, forming a blocking layer over the high-k dielectric layer, forming a hard mask layer over the high-k dielectric layer, patterning the hard mask layer, blocking layer, and lanthanum containing, and after patterning the lanthanum containing layer, removing the hard mask layer and blocking layer.

Yet another embodiment of the present disclosure provides a method comprising forming a high-k dielectric layer over a substrate, forming a lanthanum containing layer over the high-k dielectric layer, forming an aluminum oxide layer over the lanthanum containing layer, forming a titanium nitride layer over the aluminum oxide layer, patterning the titanium nitride layer, the aluminum oxide layer, and the lanthanum containing layer, and after patterning the lanthanum containing layer, performing an etch process to remove the titanium nitride layer and the aluminum oxide layer.

A further embodiment is a semiconductor device. The device includes a first transistor and a second transistor. The first transistor has a first fin protruding from a substrate. The first transistor includes a first gate structure including a first high-k dielectric layer that is over a portion of the first fin and that is substantially free of lanthanum. The second transistor has a second fin protruding from the substrate. The second transistor includes a second gate structure including a second high-k dielectric layer that is over a portion of the second fin and that includes lanthanum. A ratio of lanthanum to titanium in the second high-k dielectric layer is greater than about 50.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first transistor having a first active region, the first transistor comprising a first gate structure, the first gate structure comprising:
   a first high-k dielectric layer over a portion of the first active region, the first high-k dielectric layer being substantially free of lanthanum; and
   a first gate electrode over the first high-k dielectric layer; and
   a second transistor having a second active region, the second transistor comprising a second gate structure, the second gate structure comprising:
   a second high-k dielectric layer over a portion of the second active region, the second high-k dielectric layer comprising lanthanum, wherein a ratio of lanthanum to titanium in the second high-k dielectric layer is greater than about 50; and
   a second gate electrode over the second high-k dielectric layer.

2. The semiconductor device of claim 1, wherein the second high-k dielectric layer comprises $HfO_2$, HfZrO, HfSiO, SiO, HfTaO, HfTiO, TiO, or $Ta_2O_5$ doped with lanthanum.

3. The semiconductor device of claim 2, wherein the first high-k dielectric layer comprises a same material as the second high-k dielectric layer without lanthanum.

4. The semiconductor device of claim 1, wherein the first transistor is an n-type device, wherein the second transistor is a p-type device.

5. The semiconductor device of claim 1, wherein a concentration of lanthanum in the second high-k dielectric layer is in a range from about 5 atomic percent to about 10 atomic percent.

6. The semiconductor device of claim 1, wherein a concentration of titanium in the second high-k dielectric layer is less than or equal to about 0.1 atomic percent.

7. The semiconductor device of claim 6, wherein a concentration of titanium in the first high-k dielectric layer is less than or equal to about 0.1 atomic percent.

8. The semiconductor device of claim 1, wherein a ratio of a concentration of lanthanum to a concentration of titanium in the second high-k dielectric layer is greater than or equal to 50.

9. The semiconductor device of claim 1, wherein a ratio of a concentration of lanthanum to a concentration of titanium in the second high-k dielectric layer is in a range from 50 to 100.

10. A semiconductor device comprising:
    a first transistor having a first active region, the first transistor comprising a first gate structure, the first gate structure comprising:
    a first high-k dielectric layer over a portion of the first active region, the first high-k dielectric layer comprising a first material;
    a first work function layer over the first high-k dielectric layer, the first work function layer comprising a second material; and
    a first conductive fill over the first work function layer, the first conductive fill comprising a third material; and
    a second transistor having a second active region, the second transistor comprising a second gate structure, the second gate structure comprising:
    a second high-k dielectric layer over a portion of the second active region, the second high-k dielectric layer comprising the first material doped with lanthanum, wherein the second high-k dielectric layer comprises titanium, wherein a concentration of titanium in the second high-k dielectric layer is less than or equal to about 0.1 atomic percent;
    a second work function layer over the second high-k dielectric layer, the second work function layer comprising the second material; and
    a second conductive fill over the second work function layer, the second conductive fill comprising the third material.

11. The semiconductor device of claim 10, wherein a ratio of lanthanum to titanium in the second high-k dielectric layer is greater than about 50.

12. The semiconductor device of claim 10, wherein the first work function layer and the second work function layer has a thickness in a range from 10 angstrom to 20 angstroms.

13. The semiconductor device of claim 12, wherein the thickness of the first work function layer and the second work function layer is about 15 angstroms.

14. The semiconductor device of claim 10, wherein the second material comprises Ti, Ag, Al, TiSiN, TiAlN, TaC, TaCN, TaSiN, Mn, Zr, TiN, TaN, Ru, Mo, WN, Cu, or W.

15. A semiconductor device comprising:
    an NMOS transistor comprising a first gate dielectric, a first work function layer over the first gate dielectric, and a first conductive material over the first work function layer, wherein the first gate dielectric comprising a first high-k dielectric material, the first high-k dielectric material being substantially free of lanthanum; and
    a PMOS transistor comprising a second gate dielectric, a second work function layer over the second gate dielectric, and a second conductive material over the second work function layer, wherein the second gate dielectric comprising a second high-k dielectric material, the second high-k dielectric material comprising the first high-k dielectric material doped with lanthanum, the second high-k dielectric material comprising titanium, wherein a ratio of lanthanum to titanium in the second high-k dielectric material is greater than about 50.

16. The semiconductor device of claim 15, wherein the first work function layer and the second work function layer are a same work function material.

17. The semiconductor device of claim 16, wherein the first conductive material and the second conductive material are a same conductive material.

18. The semiconductor device of claim 15, wherein the second gate dielectric comprises a lanthanum concentration in a range from about 5 atomic percent to about 10 atomic percent.

19. The semiconductor device of claim 15, wherein the first high-k dielectric material comprises hafnium oxide.

20. The semiconductor device of claim 15, wherein a concentration of titanium in the first gate dielectric and the second gate dielectric is less than or equal to 0.1 atomic percent.

* * * * *